(12) United States Patent
Sigtermans

(10) Patent No.: US 12,189,303 B2
(45) Date of Patent: Jan. 7, 2025

(54) METHODS AND APPARATUS FOR DIAGNOSING UNOBSERVED OPERATIONAL PARAMETERS

(71) Applicant: ASML NETHERLANDS B.V., Veldhoven (NL)

(72) Inventor: David Evert Song Kook Sigtermans, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 145 days.

(21) Appl. No.: 17/923,184

(22) PCT Filed: Apr. 9, 2021

(86) PCT No.: PCT/EP2021/059270
§ 371 (c)(1),
(2) Date: Nov. 3, 2022

(87) PCT Pub. No.: WO2021/223958
PCT Pub. Date: Nov. 11, 2021

(65) Prior Publication Data
US 2023/0185202 A1 Jun. 15, 2023

(30) Foreign Application Priority Data
Aug. 5, 2020 (EP) .................................... 20173778

(51) Int. Cl.
*G03F 7/20* (2006.01)
*G03F 7/00* (2006.01)

(52) U.S. Cl.
CPC ...... *G03F 7/70508* (2013.01); *G03F 7/70525* (2013.01)

(58) Field of Classification Search
CPC ............. G03F 7/70508; G03F 7/70525; G05B 19/4099; G05B 2219/32165;
(Continued)

(56) References Cited

U.S. PATENT DOCUMENTS 6,952,253 B2    10/2005  Lof et al.
2020/0394512 A1* 12/2020  Zhang .................... G06N 7/023

FOREIGN PATENT DOCUMENTS

WO    2018/171982    9/2018
WO    2019/120826    6/2019
(Continued)

OTHER PUBLICATIONS

International Search Report and Written Opinion dated Jun. 30, 2021, issued in the corresponding International Application No. PCT/EP2021/059270.
(Continued)

*Primary Examiner* — Mesfin T Asfaw
(74) *Attorney, Agent, or Firm* — Pillsbury Winthrop Shaw Pittman, LLP

(57) ABSTRACT

An apparatus and method of diagnosing an unobserved operational parameter of a machine or apparatus. The method including obtaining a plurality of causal relationships between pairs of parameters of the machine or apparatus, wherein each pair includes a cause parameter and an effect parameter. For at least some of the parameters, a decomposition of the parameters into a plurality of information components is determined, based on the determined causal relationships between the parameters. The decomposition includes a synergistic information component including information obtained from a combination of at least two causal relationships having the parameter as effect parameter. A parameter is determined to include a negative synergistic information component. Based on the existence of the negative synergistic information component, it is diagnosed that an unobserved operational parameter provides a cause for the parameter including the negative synergistic information component.

20 Claims, 6 Drawing Sheets

(58) Field of Classification Search
CPC ........... G05B 2219/45028; G05B 2219/45031; G05B 2219/49013; G05B 19/0426
See application file for complete search history.

(56) References Cited

FOREIGN PATENT DOCUMENTS

| | | |
|---|---|---|
| WO | 2019/238348 | 12/2019 |
| WO | 2020/244853 | 12/2020 |

OTHER PUBLICATIONS

Sigtermans, David., "A Partial Information Decomposition Based on Causal Tensors", arXiv:2001.10481v4, pp. 1-13 (May 2020).
Williams, Paul L., et al., "Nonnegative Decomposition of Multivariate Information", Cognitive Science Program and School of Informatics and Computing, Indiana University, arXiv:1004.2515, pp. 1-14 (2010).
Jung, J. et al., "Simulation tool design for the two-axis nano stage of lithography systems", Mechatronics, vol. 20, No. 5, pp. 574-581 (2010).

\* cited by examiner

METHODS AND APPARATUS FOR DIAGNOSING UNOBSERVED OPERATIONAL PARAMETERS

CROSS-REFERENCE TO RELATED APPLICATIONS

This application is the U.S. national phase entry of PCT Patent Application No. PCT/EP2021/059270 which was filed on Apr. 9, 2021, which claims priority of European Patent Application No. 20173778.0 which was filed on 8 May 2020, and which is incorporated herein in its entirety by reference.

FIELD

The present invention relates to apparatus and methods of diagnosing an unobserved operational parameter of a system such as a machine or apparatus. Specifically, it involves determining a decomposition into information components of parameters of the system having causal relations between them.

BACKGROUND

Complex systems may be affected by a large number of factors. Determining which factors influence a system, how they affect a system, and how they relate to each other is often a non-trivial challenge. Complex systems may comprise machines, apparatus, and/or equipment, such as a lithographic apparatus described below. Systems can relate to a wide range of fields extending beyond machines and apparatus, for example biological, medical, and/or environmental systems.

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-k1 lithography may be used to process features with dimensions smaller than the classical resolution limit of a lithographic apparatus. In such process, the resolution formula may be expressed as $CD = k_1 \times \lambda / NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

Systems, such as the lithographic apparatus described above, can be monitored and characterised by obtaining data relating to the system, for example using metrology and/or modelling. The data may represent a number of different parameters describing different aspects of the system. The data may be used to monitor or analyse the system, for example to determine updates to the system or to make predictions or inferences about the future performance, behaviour or status of the system. In the case of a lithographic apparatus, the data may for example be used to determine updates to the lithographic process settings, or to predict apparatus performance and/or failure.

SUMMARY

It is an object of the present invention to provide a method of adjusting operational settings of a machine or apparatus, and/or a method for control and/or validation of a system design for a machine or apparatus. The machine or apparatus may for example be a lithographic apparatus, or holistic lithographic system.

According to a first aspect of the current disclosure there is provided a method of adjusting operational settings of a machine or apparatus. The method comprises obtaining a plurality of causal relationships between pairs of observable parameters of the machine or apparatus, wherein each pair comprises a cause parameter and an effect parameter. A decomposition of the parameter into a plurality of information components is determined for at least some of the parameters, based on the obtained causal relationships between the parameters, wherein the decomposition of the parameter comprises a synergistic information component comprising information obtained from a combination of at least two causal relationships having the parameter as effect parameter. The method comprises determining that a first parameter comprises a negative synergistic information component, based on the existence of the negative synergistic information component, the method diagnoses that an unobserved operational parameter provides a cause for the first parameter comprising the negative synergistic information component. An adjustment is made to a setting of the machine or apparatus to provide a desired change to the first parameter, wherein the adjustment is calculated by including an effect of the unobserved operational parameter.

Optionally, the method may further comprise assembling a causal graph based on the plurality of causal relationships between pairs of parameters.

Optionally, the plurality of causal relationships may comprise quantified relationships.

Optionally, the decomposition may be a partial information decomposition.

Optionally, the plurality of information components may further comprise a unique information component, a redundant information component, and a self-information component.

Optionally the method may further comprise determining a total information of the parameter based on information entropy of the parameter, wherein the sum of the information components of the parameter is equal to the total information of the parameter.

Optionally, the information entropy may be Shannon entropy.

Optionally, determining the synergistic information component of the first parameter may comprise determining a total information of the first parameter. The method may further comprise, determining a redundant information component, based on information contained in multiple causal relationships having the first parameter as effect parameter. The method may further comprise determining a unique information component, based on information contained in only one of the causal relationships having the first parameter as effect parameter. The method may further comprise determining a self information component, based on information native to the first parameter. The method may further comprise determining the synergistic information component by subtracting the unique information component, the redundant information component, and the self information component from the total information component.

Optionally, obtaining a plurality of causal relationships may comprise receiving data values of a plurality of parameters of the machine or apparatus, and determining causal relationships between pairs of parameters based on the data values of the plurality of parameters.

Optionally, the method may further comprise identifying that one of the determined causal relationships between a pair of parameters is spurious based on the diagnosed unobserved parameter, and removing the spurious causal relationship from the plurality of causal relationships.

Optionally, the method may further comprise predicting a performance of the machine or apparatus based on at least in part the diagnosed unobserved operational parameter.

Optionally, the machine or apparatus may comprise a lithographic apparatus.

Optionally, the machine or apparatus may comprise a metrology tool.

Optionally, the machine or apparatus may comprise a lithographic cell.

According to another aspect of the disclosure, there is provided a method for control and/or validation of a system design for a machine or apparatus. The method comprises obtaining a plurality of causal relationships between pairs of observable parameters of the machine or apparatus, wherein each pair comprises a cause parameter and an effect parameter. For at least some of the parameters, a decomposition of the parameter into a plurality of information components is determined, based on the obtained causal relationships between the parameters, wherein the decomposition of the parameter comprises a synergistic information component comprising information obtained from a combination of at least two causal relationships having the parameter as effect parameter. The method comprises determining whether a first parameter comprises a negative synergistic information component. Based on whether the negative synergistic information component exists, it is diagnosed whether an unobserved operational parameter exists that provides a cause for the first parameter comprising the negative synergistic information component. Control and/or validation of the system design for the machine or apparatus is performed, based on whether an unobserved parameter is diagnosed, wherein diagnosis that no unobserved operational parameter exists is used as validation of the system design.

All of the optional features described above in relation to a method of adjusting operational settings of a machine or apparatus may also be optional features of the method for control and/or validation of a system design for machine or apparatus.

According to another aspect of the current disclosure there is provided an apparatus for diagnosing an unobserved operational parameter of a machine or apparatus, comprising one or more processors and a memory storing instructions that, when executed, result in the processor performing a method as set out above.

According to another aspect of the current disclosure there is provided an apparatus for performing control and/or validation of a system design for a machine or apparatus, comprising one or more processors and a memory storing instructions that, when executed, result in the processor performing a method as described above.

BRIEF DESCRIPTION OF THE DRAWINGS

Embodiments of the invention will now be described, by way of example only, with reference to the accompanying schematic drawings, in which.

DETAILED DESCRIPTION

An exemplary system will now be described, comprising one or more of a lithographic apparatus, a lithographic cell, a metrology tool, and a computer system.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
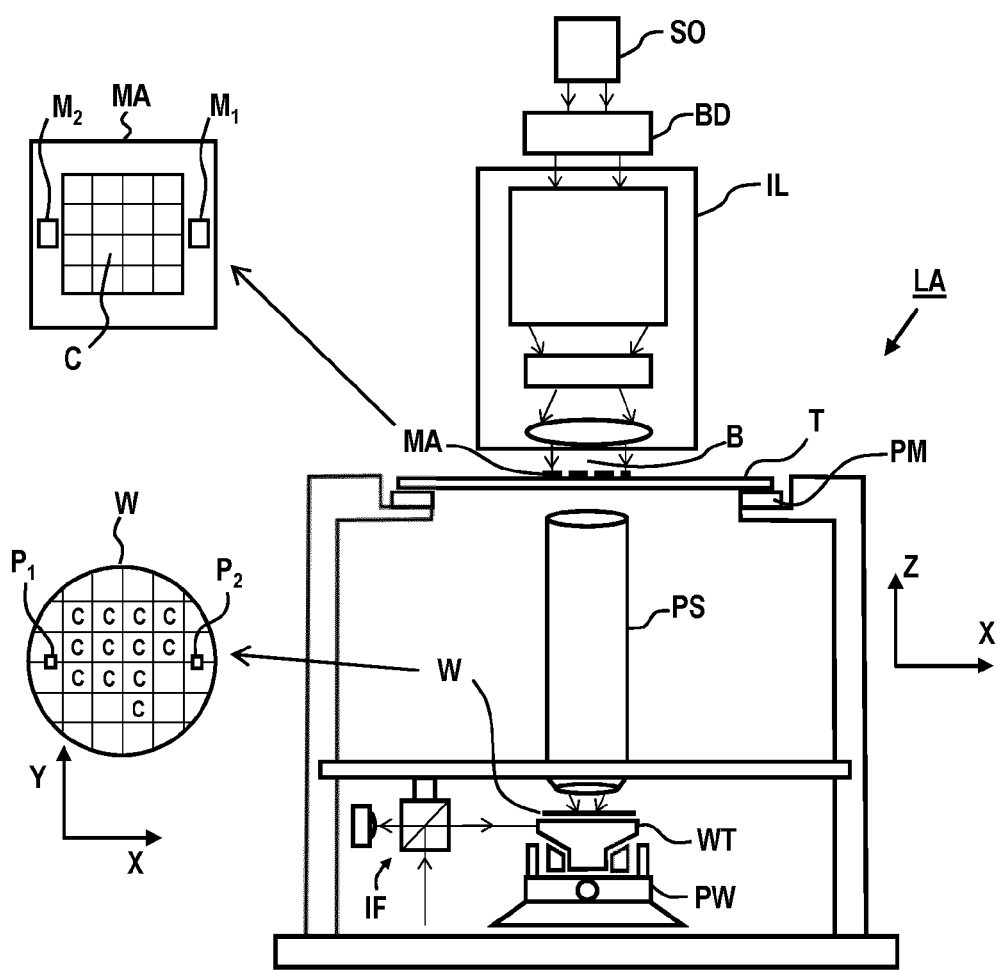
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
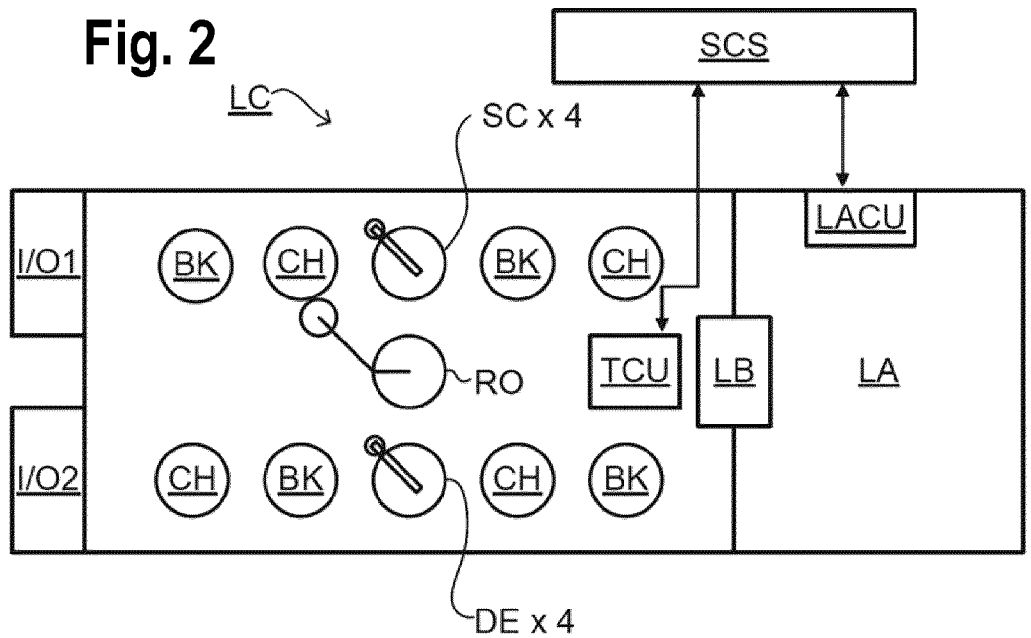
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
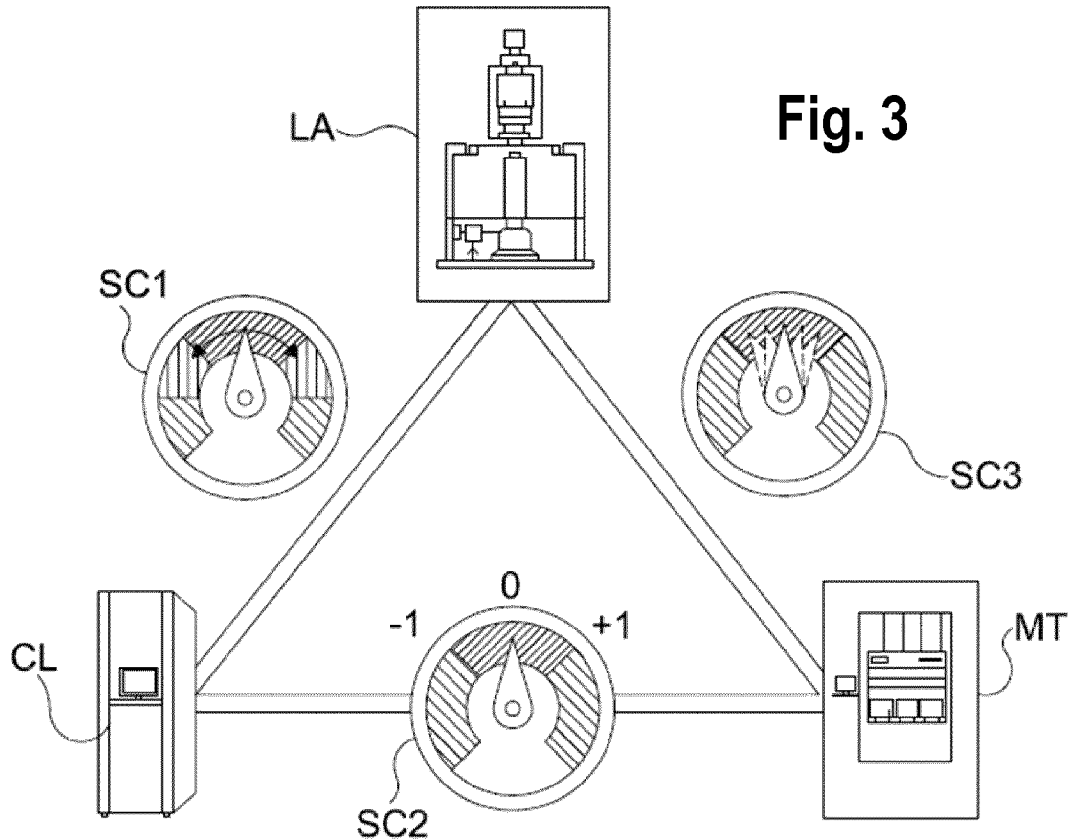
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Metrology tools MT may be used to obtain data relating to the lithographic apparatus LA. The data may comprise values of one or more parameters, wherein the parameters may describe a specific aspect or variable of the lithographic apparatus LA. The measured data may also be considered as observables of the lithographic apparatus LA, as they are parameters of the apparatus that may be observed, through measurement. Other observables may exist, which may not be directly measured by a metrology tool MT. Such observables may for example be calculated based on measured data, modelled data, information relating to the status or characteristics of the machine etc. Examples of parameters related to a lithographic apparatus may include for example temperatures, currents, voltages, intensities, durations (time lengths), misplacements, occurrence of errors (may be a yes/no value).

Some variables affecting a lithographic apparatus LA may not be observable, that is to say, data relating to this aspect may not be obtained through measurement, modelling, and/or information on the apparatus characteristics. This means that there may be variables of the lithographic apparatus LA system that are not observed. These variables may be expressed in the form of parameters of the system, which may be referred to as unobserved operational parameters, or simply unobserved parameters. The existence of unobserved parameters can pose a challenge for the monitoring, analysis, and control of the system. It may result in incorrect or incomplete results or conclusions being determined from the data.

One example application in which analysis of lithographic apparatus LA data may be used, is for the diagnosis of failures and/or design issues of the apparatus LA. Diagnosing such issues may be time consuming. If not detected, the cost may include lower quality output by the apparatus LA, for example due to a partial failure of the apparatus or a design fault. Another cost may be downtime for the apparatus as a result of an undiagnosed failure stopping operation of the machine, until the failure is discovered, identified, and resolved. The presence of unobserved parameters may slow down the diagnosis of a cause of a failure or design issue, due to an incorrect interpretation of the causes and relationships of different aspects affecting the apparatus LA. Being able to tell whether there is an unobserved variable, may save a lot of time in the analysis process. Furthermore, diagnosing the existence of a previously unobserved variable, can be used for example to adjust operational settings of the system, to validate or improve a design of the system, or to improve future analysis of the apparatus LA.

There are several existing techniques to infer the existence of a parameter based on expert domain knowledge hypothesising such a parameter exists. Proposed herein is a data-driven approach to inferring the existence of an undiagnosed parameter in a system such as a lithographic apparatus LA. The method proposed herein may further be used to infer not just the existence of an unobserved parameter, but also properties of its behaviour. Once the unobserved parameter has been diagnosed, this information may be used to update models and knowledge relating to the lithographic apparatus. The models may for example be used to predict performance and/or failure of different parts and/or components of the apparatus LA. Knowledge of the previously unobserved parameter may be used to update design or settings of a lithographic apparatus to improve its performance.

The diagnosis of an unobserved parameter may be based on analysis of the information of the system. Information may be understood as a way of expressing how different variables affect each other, and create, share, and pass on effects within the system. In a lithographic apparatus LA, the information may be describe how different parameters used to describe the system relate to each other and/or how they affect the functioning and performance of the lithographic apparatus LA.

The amount of information present in a parameter may be associated with the entropy of a parameter. The information may be seen as the amount of variation or uncertainty the parameter can hold. The entropy may be Shannon entropy. The skilled person will appreciate that other definitions of entropy suitable for information theory may be used in relation to the current disclosure. As an example, a parameter may be represented by a single bit, a binary value. This parameter may take on one of two values: 0 or 1. In another example, a parameter may be represented by a letter a to z, and may take on any one of twenty-six values. It is clear that the latter example can contain more information (26 different values) than the former (2 values).

Figure 4:
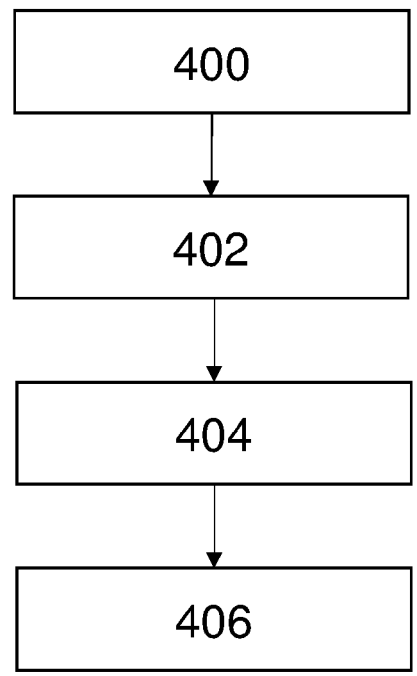
FIG. 4 depicts a flow diagram of steps in a method of diagnosing an unobserved operational parameter in a system.

FIG. 4 depicts a flow diagram of steps in a method of diagnosing an unobserved operational parameter of a complex system such as a machine or apparatus. The machine or apparatus may for example be a lithographic apparatus LA. In step 400 a plurality of causal relationships between pairs of parameters is obtained, wherein the parameters are associated with the machine or apparatus. The parameters may be observable. Each causal relationship has a cause parameter and an effect parameter. In step 402 a decomposition of a parameter into a plurality of information components is determined. The decomposition may be determined based at least in part on the causal relationships. The decomposition is determined for at least some of the plurality of parameters. The system may comprise a plurality of parameters comprising at least three parameters. The decomposition may be determined for each of the plurality of parameters. The decomposition is determined based on the causal relationships between the parameters. The plurality of information components comprises a synergistic information component. The synergistic information component may represent information that is obtained from a combination from at least two cause parameters having the parameter for which the information decomposition is an effect parameter.

In step 404 it is determined for one of the parameters that the synergistic information component of the parameter is negative. This parameter may be referred to as a first parameter. The first parameter may be any of the plurality of parameters that is the effect parameter in at least one causal relationship. The negative synergistic information component may be an indication of the existence of an unobserved operational parameter. Therefore, in step 406 an unobserved parameter of the machine or apparatus is diagnosed as being a cause for the first parameter comprising the negative synergistic information component. Diagnosis of an unobserved parameter may involve inferring a suspicion that an unobserved parameter exists. This diagnosis may then be passed on for further analysis of the system, for example to establish what the unobserved parameter may represent.

An important aspect of the method described above, is that the decomposition into information components may be performed in such a way that a negative synergistic information component represents an impossible solution to the decomposition. The inventor has realised that the occurrence of a negative synergistic information component can therefore be interpreted as an indication of an error present in the data on which the decomposition is based. Specifically, if a parameter has a negative synergistic information component, this may be an indication of the existence of an unobserved parameter being a cause for that parameter.

The decomposition of parameter into a plurality of information components may be based on a combination of knowledge about the parameter, and knowledge of the causal relationships of the parameter. The knowledge of the parameter may include for example data values of the parameter, historic knowledge of the parameter, etc. Apart from the parameter itself, information obtained from combinations of multiple parameters may be included. The combinations of multiple parameters that are taken into account may be based on the causal relationships between the parameters.

The method above described a way of analysing information flow between a plurality of parameters in a system, based on data relating to causal relationships of that system. The method may be used to determine whether the data on relationships is complete or incomplete. An advantage of the method described above may be that it uses a data-based approach to discover irregularities in the determined causal relationships between parameters of the system. The irregularities may be identified through the existence of the negative synergistic information component. The identification of irregularities may be used to infer that there are hidden confounding factors (i.e. an unobserved parameter) in the system. In some information decompositions, for example a partial information decomposition as described in P. Williams et al., *Nonnegative Decomposition of Multivariate Information, preprint* (2010), 1004, information components are expected to be non-negative. A negative synergistic information component can be interpreted as an effect parameter losing information as a result of a combination of information from two or more cause parameters. Therefore, the negative synergistic information component may be an indication that the set of causal relationships is inaccurate.

Diagnosing an unobserved parameter may lead to improved performance of processes or settings of the system based on those parameters. The parameters and data related to them may for example be used to build and run models of the system, e.g. machine learning models, deep learning models, applications using big data. If an unobserved parameter is not taken into account, the model may be subject to overfitting. Diagnosing an unobserved parameter and updating a model to take the diagnosed parameter into account may therefore help prevent or reduce overfitting in models.

Figure 5:
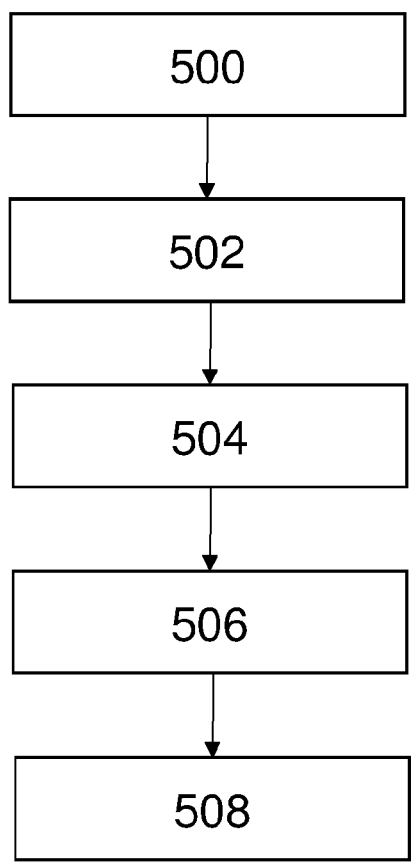
FIG. 5 depicts a flow diagram of steps in a method of adjusting operational settings of a machine or apparatus.

FIG. 5 depicts a method of adjusting operational settings of a machine or apparatus. The method uses a method of determining whether an unobserved operational parameter exists, so that steps 500-506 of FIG. 5 correspond to steps 400-406 of FIG. 4, respectively. In step 500 a plurality of causal relationships between pairs of parameters is obtained. The parameters may be observable. A parameter being observable may comprise for example the parameter being measureable directly, or indirectly (e.g. calculated or determined based on other parameter values). Alternatively or additionally, the parameters may be modelled. In step 502 a decomposition into a plurality of information components is be determined for at least some of the parameters. One of the information components is a synergistic information component. In step 504, one or more of the synergistic information components is found to have a negative value. Based on this finding, in step 506 the existence of an unobserved operational parameter is diagnosed. In step 508, an adjustment to an operational setting of the machine or apparatus may be determined and/or implemented. The adjustment may be associated with a change to a parameter for which an information decomposition resulted in a negative synergistic information component. The adjustment may be determined based on the diagnosis of an unobserved operational parameter. The adjustment may be calculated by including an effect of the unobserved operational parameter.

Figure 6:
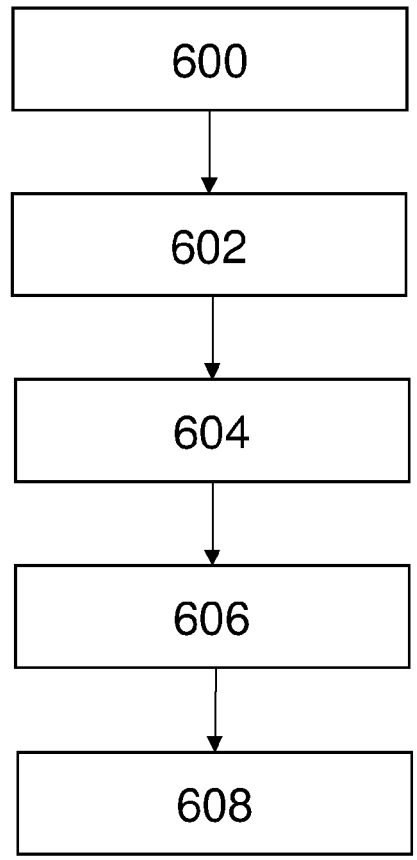
FIG. 6 depicts a flow diagram of steps in a method for control and/or validation of a system design for a machine or apparatus.

FIG. 6 depicts a method of control and/or validation of a system design for a machine or apparatus. The steps 600-606 of FIG. 6 correspond to steps 400-406 of FIG. 4, and steps 500-506 of FIG. 5, respectively. In step 600 a plurality of causal relationships between pairs of parameters is obtained. The parameters may be measureable directly, or indirectly (e.g. calculated or determined based on other parameter values). Alternatively or additionally, the parameters may be modelled. In step 602 a decomposition into a plurality of information components is be determined for at least some of the parameters. One of the information components is a synergistic information component. In step 604, it is determined whether one of more of the synergistic information components have a negative value. As described above, if a negative synergistic information component is determined for one or more parameters, this indicates the existence of an unobserved operational parameter. Thus, at step 606 the existence of an unobserved operational parameter is diagnosed. In step 608, control and/or validation of the system design for the machine or apparatus is performed. The control and/or validation may be based on whether an unobserved operational parameter is diagnosed. A diagnosis that no unobserved operational parameter exists may be used as a validation of the system design. A diagnosis that an unobserved operational parameter exists may be used to control the system design. The system design may be adjusted based on the diagnosis of a negative synergistic information component.

The system design may comprise a model or other understanding describing whole or part of the machine or apparatus, or a system and/or method related to the machine or apparatus. A system design may for example be used to determine how to provide operating settings of the machine. The system design may be based on the plurality of parameters of the machine or apparatus, and the relationships between them. Control of the system design may comprise quality control for checking the accuracy of the system design. Validation of the system design may comprise testing the system design, for example to identify errors. Using the method described in relation to FIGS. 4-6, if no negative synergistic information component is identified for any of the parameters, this may be seen as a validation of the system design. Said otherwise, if no unobserved operational parameter has been diagnosed, the system design is validated. In the case where one or more unobserved operational parameters are diagnosed the system design may be adjusted to take into account this diagnosis. The effect and the type of adjustment to the system design and or operational settings of the apparatus or machine may be dependent on the system, and the diagnosed unobserved parameter. The functioning of the methods described herein is independent of the type of adjustment, control, and/or validation.

A causal graph may be assembled based on the plurality of causal relationships between the pairs of parameters. A causal graph may be a representation of the plurality of causal relationships between the plurality of parameters of the system. The parameters may be nodes of the graph. The causal relationships may be edges of the graph. The edges may have a direction, for example represented by arrows, indicating the cause and effect for a relationship. Causes and effect parameters may also be referred to as parent and child nodes. A causal graph may be based on the probability mass functions of the parameters. In a causal graph, a path of multiple modes may be found comprising a series of nodes and edges, wherein an effect parameter of one edge/causal relationship acts as a cause parameter for a next edge. The multiple edge causal relationships may be referred to as indirect causal relationships. The indirect cause parameters/nodes may be referred to as second grandparents, second generation causes, third generation causes, etc. A causal graph may be represented as a collection of nodes connected by edges. Other representations, for example using a matrix, may also be used.

The determination of an information decomposition will now be described in more detail. The information in a parameter can be seen as a combination of information provided by the environment, i.e. other parameters in the system, and information native to the parameter itself. Native information may also be referred to as self-information. Information may be expressed in 'bit', a unit for mutual information. Parameter information from the environment may be received from cause parameters. The cause parameters may be direct causes, that is to say, they have a direct causal relationship to the effect parameter. Indirect causes, from second, third, etc. parameters contributing information to the effect, may be ignored. Their contribution to the information may be taken into account via the direct causes.

The information provided to a parameter by its environment may consist of a unique information component, a redundant information component, and a synergistic information component. The unique information component may comprise information provided by cause parameters, separately. The unique information component of an effect parameter may be the sum of the information provided by each of the direct cause parameters of that effect parameter. The redundant information component may comprise information that is received via multiple causal relationships. The redundant information may also be referred to as shared information. The information may be shared by direct and/or indirect cause parameters. The synergistic information component may contain information that is only apparent when two or more direct cause parameters are combined.

In the plurality of causal relationships of the known parameters of the system, each cause parameter, or node, may contribute a specific amount of information to the effect node. However, part of the total information provided by a cause parameter is unique to that specific cause parameter, while another part may be redundant and shared with other cause parameters of the effect parameter. The unique information provided by a specific parameter to an effect parameter may be defined as the total information contributed to the effect parameter by the specific parameter minus the redundant information transmitted via that specific parameter. Unique information may be delivered to an effect parameter only via direct causal relationships.

The method described above allows for the assembly of an information ledger, based on the determined information components. An information ledger may comprise an overview of the information components for at least some of the parameters of the system. The information ledger may comprise the information for all the known parameters of the system. The information ledger may further comprise information on the causal relationships between the parameters. The information ledger may further comprise information on the amount of information in a parameter and the sources of that information. In some cases, the self-information native to a parameter may be left out of the information ledger.

Figure 7:
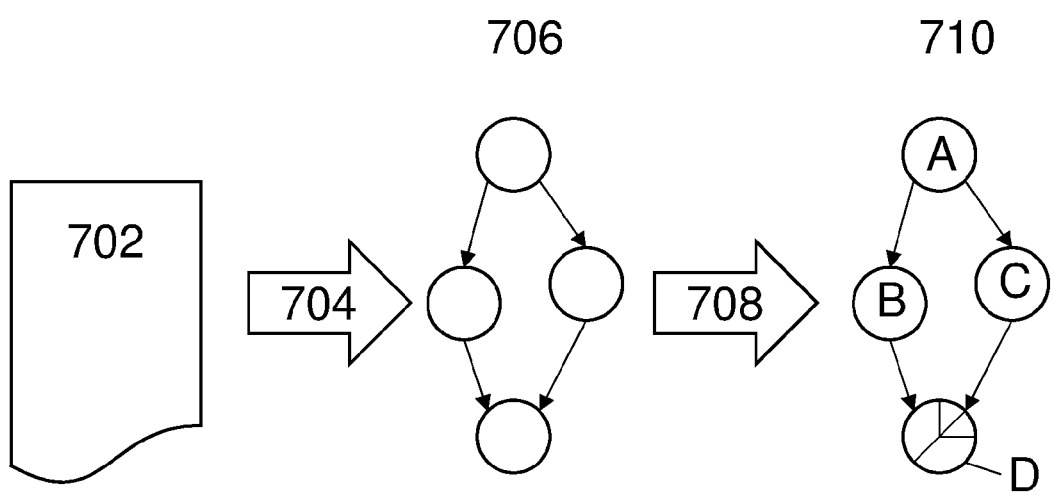
FIG. 7 depicts a schematic diagram representing steps in a method of determining an information ledger for a system comprising a plurality of parameters.

FIG. 7 depicts a schematic diagram representing steps of determining an information ledger comprising the information decomposition for a plurality of parameters. Obtained information 702 about causal relationships between a plurality of parameters is used to determine and construct 704 a causal graph 706. The causal graph 706 can be represented graphically as nodes (parameters) connected by edges (causal relationships). Arrows may indicate the cause and effect in a relationship. Based on the causal relationships, a partial information decomposition 708 into non-negative information components may be performed. The decomposition may be performed for each node/parameter in the causal graph. Next to the causal relationship, further knowledge and information about the parameters and the system may be used to determine the information decomposition. The resulting decomposition can be used to build an information ledger 710. In FIG. 7, a schematic representation of a decomposition of the bottom node D is illustrated. The separation of the node into separated sections may represent the different information components, including redundant information received from nodes B and C, unique information received from node B and node C, self/native information originating from node D itself, and synergistic information.

Figure 8A:
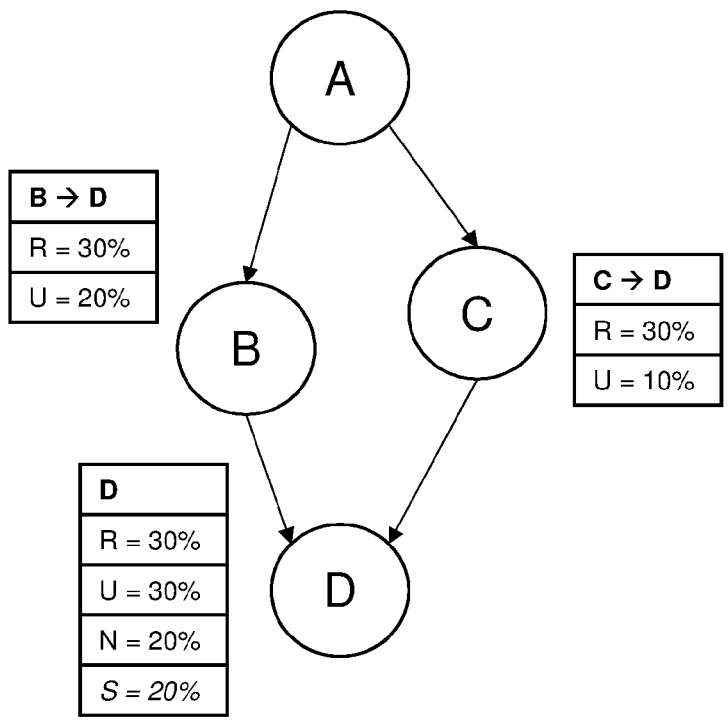
FIG. 8(a) depicts a causal graph and an information decomposition for one of the nodes in the graph.
Figure 8B:
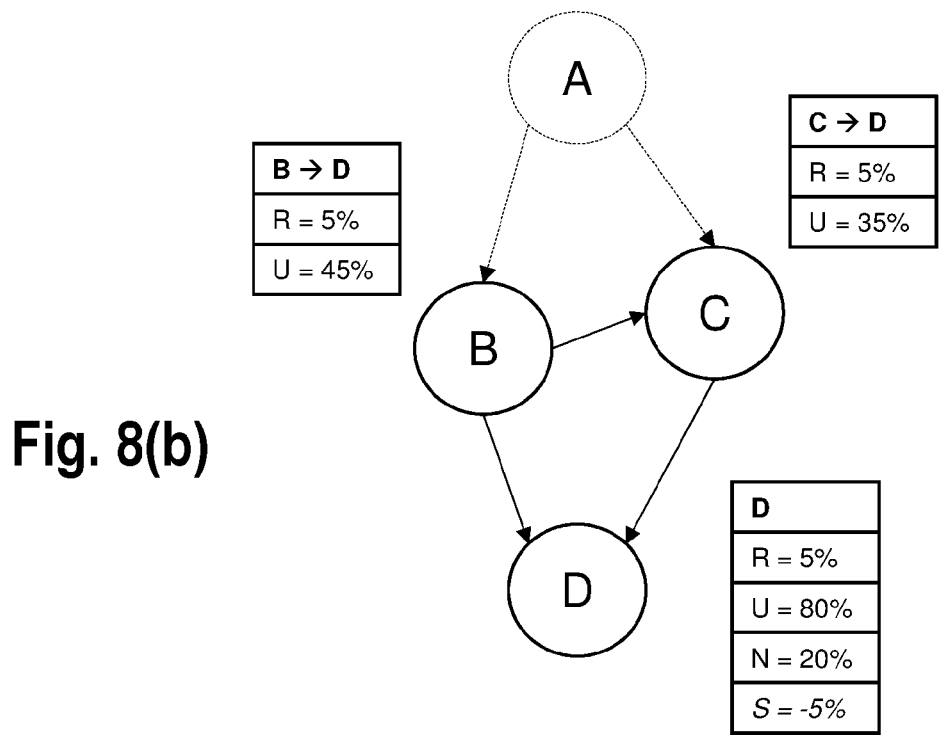
FIG. 8(b) depicts a causal graph with an unobserved parameters and an information decomposition for one of the nodes in the graph.

FIG. 8(*a*) depicts a simple causal graph, for illustrative purposes. The graph comprises 4 nodes A, B, C, D representing 4 parameters. An information decomposition for node D is illustrated. Node D is an effect parameter of 2 causal relationships, having nodes B and C as cause parameters, respectively. Using information theory, the information transfer between nodes may be analysed. The analysis may use knowledge of the causal relationships. The analysis may further use information of the plurality of parameters. As part of the analysis, the contribution of different information components may be determined. An example situation is depicted of a partial information decomposition of parameter D with regards to its direct cause parameters B and C. In the example, 30% of the information of parameter D is redundant information, received from both nodes B and C. 30% of the information is unique information, in which 20% is received from parameter B, and 10% is received from parameter C. 20% of the information of D is native to parameter D itself. The remaining 20% of information in D is determined to be synergistic information.

FIG. 8(*b*) depicts a causal graph for the same system as in FIG. 8(*a*). However, it depicts a situation in which parameter A is unobserved, as indicated by a dashed line. As a result, the causal relationships in the graph, and the resulting information ledger look different. Due to the unobserved parameter A, an apparent, spurious, causal relationship between parameters B and C may have been identified. Because of this apparent relationship between parameters B and C, the redundant information between them must decrease. This may be a result of data processing inequality. The resulting information ledger determined for node D shows that 5% of the information of D is redundant, 80% is unique information received from the environment, 45% from parameter B and 35% from parameter C. The self-information remains at 20%. Based on the unique, redundant, and self-information of parameter D, the synergistic information component is determined to be −5%, to reach a total of 100%. This negative value of the synergistic information component is used as an indication that there is an error in the analysed system of FIG. 8(*b*), and the existence of an unobserved parameter is inferred.

The steps in the method depicted in FIG. 4 for diagnosing an unobserved variable will now be described in more detail. In step 400, obtaining a plurality of causal relationships may comprise receiving the plurality of causal relationships and the parameters they relate to. Alternatively or additionally, it may comprise receiving data values of a plurality of parameters of the system. The method may then comprise determining a plurality of causal relationships between pairs of parameters based on the received data values. The data values may be time series values. The determination of the causal relationships may be performed as set out in European patent application No. 19177967.7, incorporated herein by reference.

The causal relationships may be quantified, that is to say, the relationships may comprise an indication of the strength of the causal relationship. The quantification may be an indication of the amount of information transmitted from a cause parameter to an effect parameter. The determination of a quantified causal relationship may be determined by using the received data values to identify how information flows between cause and effect parameters. This quantification may for example be achieved by determining communication channels between parameters. A communication channel may comprise a plurality of linear transformations to transform a probability mass function of a first parameter to a probability mass function of a second parameter. The communication channels may have channel capacities, an indication of the strength of a causal relationship between a cause parameter and an effect parameter.

The causal relationships may be used to construct a causal graph. Edges that have a channel capacity of 0, i.e. there is no causal relation, may be removed from the causal graph. Indirect edges, that is to say, second, third, or higher order indirect causal relationships, may also be removed. Information transmitted via indirect links may all be represented as information transmitted through a cascade of direct causal relationships.

Once the causal relationships have been set, for example in a causal graph, the information decomposition may be performed for some or all parameters. The information decomposition may be a decomposition into non-negative components, that is to say, all components may be expressed as real positive numbers with a value greater than or equal to zero. The decomposition may for example be a partial information decomposition. Said differently, the total information of a parameter may be written as a sum of non-negative information components. A synergistic information component may be determined by determining the total information of a parameter, determining the other information components of the decomposition, and determining the synergistic information component by subtracting the other information components from the total information of the parameter. If the resulting synergistic information component is negative, this may indicate the causal relationships on which the information decompositions was based contain one or more errors.

Determining the total information of a parameter may be based on the information entropy of the parameter. In order to determine the total information of a parameter, the method may comprise receiving knowledge of the parameter for which the information decomposition is performed. The knowledge may comprise data that allows the range of possible values of the parameter to be determined or estimated. The knowledge may for example comprise a probability mass function and/or a probability density function of the parameter. The knowledge may additionally or alternatively comprise a plurality of data values of the parameter. Part of the method may comprise determining a probability mass function or probability density function for the parameter based on received data values of the parameter. The information entropy may be Shannon entropy.

In an example determination of total information using Shannon entropy, a probability mass function of a parameter may be known. The probability mass function may represent the relative frequency of every possible value that parameter may assume. As an illustrative example, 1000 data samples are received for an exemplary parameter which is able to be one of three possible values: '1', '2', and '3'. The probability mass function indicates how often each of the three values is present in the 1000 samples. The Shannon entropy may be defined as Entropy=$-\Sigma_{i=1}^{N} p(i) \log_b[p(i)]$. N is the number of values the parameter can assume, b is the base of the algorithm (e.g. if b=2, the unit is bit), and p(i) is the probability of the value. The sum over the probability mass function equals 1 ($\Sigma_{i=1}^{N} p(i)=1$). In the example of 1000 samples for a parameter with 3 possible values, given the following frequency: p('1')=0.3, p('2')=0.3, p('3')=0.4, the entropy would be: Entropy=$-0.3 \log_2[0.3]-0.3 \log_2[0.3]-0.4 \log_2[0.4]$=1.571. The example given for calculating total information using Shannon entropy is non-limiting. Other methods for calculating entropy known in the art may be used for calculating the total information of a parameter.

Once the total information for a parameter has been determined, a decomposition of information into categories may be made. The categories may be a redundant information component, a self-information component, a unique information component, and a synergistic information component. The decomposition may be complete, that is to say, the sum of the components in the different categories may always be equal to the total information of the parameter. Therefore, if the total information of a parameter is known, e.g. if it has been determined using the method described above, it is possible to calculate all but one of the information components, and then to determine the information component of the remaining category by subtracting the other information components from the total information.

Figure 9:
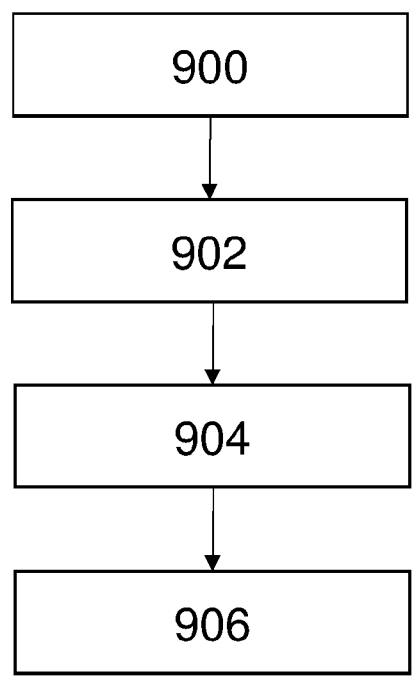
FIG. 9 depicts a flow diagram of steps in a method of determining a synergistic information component in an information decomposition for a parameter.

FIG. 9 depicts a flow diagram of steps in a method of determining the synergistic information component of a parameter. In step 900, the total information of the parameter is determined. In step 902, a redundant information component is determined, based on information contained in multiple causal relationships having the parameter as effect. In 904, a unique information component is determined, based on information contained in only one of the causal relationships having the parameter as effect. The determination of the unique and redundant information components may be based on the causal relationships. It may also be based on channel capacities in causal graphs. In step 906 a self-information component is determined, based on information native to the parameter. In step 908, the synergistic information component is determined by subtracting the unique information component, the redundant information component, and the self-information component from the total information of the parameter.

Redundant information may arise due to the existence of an indirect relationship. For example, if X causes Y, and Y causes Z, then the relationship between X and Z is indirect, and exists via a path comprising two edges. For a parameter, all paths from all other parameters are considered. A path may only consider each parameter once. All paths that consist of the same parameters, but in a different order, are said to belong to the same family. For each family, the redundant information equals the information of the path in the family that transmits the least amount of information. This determination of redundant information may be performed for each family and/or for each parameter.

Unique information may arise due to direct relationships, i.e. over paths comprising a single causal relationship/edge. The unique information transmitted from a specific cause parameter to a specific effect parameter may equal the total information transmitted via the causal relationship minus the sum of all redundant information families comprising the cause parameter and ending at the effect parameter. The total information of a causal relationship may be determined for example using mutual information, transfer entropy, and/or channel capacity.

The decomposition described in relation to FIG. 9 may be a decomposition into non-negative information components. For a non-negative information decomposition, if the determined synergistic information component is negative, this indicates there is an error in the decomposition. If the decomposition calculations were performed correctly, this means there is an error in the causal relationships and/or parameter knowledge used to determine the decomposition. The inventors have realised that if there is an unobserved common cause between two parameters, e.g. an unobserved cause parameter that directly causes two effects, the synergistic information contribution of those two effects must be negative. Therefore, if a negative synergistic information component is determined for a parameter, the existence of an unobserved parameter may be diagnosed. The unobserved parameter may be a common cause for at least two of the cause parameters having the parameter as effect.

As mentioned above, a causal graph may be based on the probability mass functions of the parameters in the causal graph. Each parameter may have a probability mass function, and a combination of two or more parameters may have an associated combined probability mass function assembled from the probability mass functions of the individual parameters forming the combination. For a non-negative information decomposition, the probability mass functions and combined probability mass functions may be used to calculate the redundant information component. The combined probability mass functions taken into account may be those of any possible combination of parameters. The redundant information component of a parameter may therefore be defined in terms of paths of the causal graph. Once the redundant information component has been determined for a parameter, the probability mass function and the redundant information component may be used to determine a unique information component. The synergistic information component is determined based on the redundant information component, the unique information component, and the total information in the parameter resulting from the joined parameters.

Based on the diagnosis of an unobserved parameter for the system, further analysis of the relevant causal relationships and parameters may be performed. In response to the diagnosis, the unobserved parameter may be identified, and added to the plurality of parameters of the system. One or more causal relationships may be determined in relation to the identified parameter. For example, one or more causal relationships to the parameters that resulted in a negative synergistic information contribution may be added.

In response to diagnosing an unobserved parameter, one or more causal relationships in the causal graph may be identified to be spurious. If a causal relationship is identified to be spurious, it may be removed. For example, in relation to FIG. 8(*b*), upon identifying unobserved parameter A, causal relationships to parameters B and C may be added (dashed lines). In case it found to be spurious as a result of the addition of parameter A, the causal relationship between nodes B and C may be removed. Furthermore, in response to the diagnosis of an unobserved parameter, one or more settings of the system may be adjusted. A model of the system may be updated to include the identified parameter, and/or additions or removals of causal relationships.

The information decomposition of a parameter may be performed based on any method known in the art. The method for determining an information decomposition for a parameter may be repeated for some or all of the known plurality of parameters.

The methods and apparatus described herein may be used for analysing information flow inside a complex system, in particular for diagnosing an unobserved parameter in a system. In order for the methods described herein to be suitable for analysis of a system, observational data may be used that allows the determination of causal relationships between a plurality of variables/parameters of the system. The data may be cast in numerical form so that it may be processed relating to information theory. Numerical data may for example comprise time series data for a plurality of parameters. The time series data may be used to determine causal relationships between parameters of the system, e.g. to build a causal graph. Examples of time series data include analysis of prevalence of diseases and/or medical conditions in a population, the occurrence of events of interest within a certain time frame (e.g. weather, traffic), sensor readings and metrology data values obtained over time, etc.

The methods described may be applied to a lithographic apparatus LA, a lithographic cell LC, and/or related metrology apparatus MT described in more detail above. The methods may also be applied to models describing whole or part of a lithographic apparatus LA, lithographic cell LC, and/or metrology tools MT. The methods may applied to other complex machines and/or apparatus. It may also be applied to other systems, not related to machines or apparatus. Example systems include the diagnosis of medical conditions, effects of exercise and diet on health, weather predictions, traffic analysis and predictions, spread of diseases, effects of climate change, pollution monitoring and prediction, impact of policy decisions on economic performance, etc.

The diagnosed parameter may be used to update settings in the system. The diagnosed parameter may be used to implement design changes in the system and/or processes performed by or in relation to the system. The diagnosed parameter may be added to a model of whole or part of the apparatus. The model may for example be used to predict operation of the apparatus. The model may be used to predict a performance of the apparatus, which may comprise a prediction of a failure of one or more components of the apparatus. This may for example be used to schedule predictive maintenance of an apparatus, to avoid downtime as a result of failure of a component of the apparatus. In relation to a lithographic apparatus LA, cell LC, or metrology tool MT, the diagnosis of an unobserved parameter may be used to update recipe settings relating to a lithographic exposure.

The methods described herein may be performed by an apparatus. The apparatus may comprise a non-transitory storage medium, i.e. memory, storing instructions related to the methods described herein. The apparatus may further comprise one or more processors configured to execute the instructions stored in memory in order to perform the methods described herein. The apparatus comprising the processor and/or memory may be the apparatus or machine to be analysed itself, or may be a separate apparatus, associated with the machine, apparatus, or system to be analysed.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method comprising:
obtaining a plurality of causal relationships between pairs of observable parameters of a machine or apparatus, wherein each pair comprises a cause parameter and an effect parameter;
determining, for at least some of the parameters, a decomposition of a parameter of the at least some parameters into a plurality of information components based on the obtained causal relationships between the parameters, wherein the decomposition comprises a synergistic information component comprising information obtained from a combination of at least two causal relationships having the parameter as effect parameter;
determining that a certain parameter comprises a negative synergistic information component;
diagnosing, based on the existence of the negative synergistic information component, that an unobserved operational parameter provides a cause for the certain parameter comprising the negative synergistic information component; and
making an adjustment to a setting of the machine or apparatus to provide a desired change to the certain parameter, wherein the adjustment is calculated by including an effect of the unobserved operational parameter.

2. The method according to claim 1, further comprising assembling a causal graph based on the plurality of causal relationships between pairs of parameters.

3. The method according to claim 1, wherein the plurality of causal relationships comprise quantified relationships.

4. The method according to claim 3, wherein the decomposition is a partial information decomposition.

5. The method according to claim 4, wherein the plurality of information components further comprise a unique information component, a redundant information component, and a self-information component.

6. The method according to claim 1, further comprising determining a total information of a parameter of the at least some parameters based on information entropy of the parameter, wherein the sum of the information components of the parameter is equal to the total information of the parameter.

7. The method according to claim 6, wherein the information entropy is Shannon entropy.

8. The method according to claim 1, wherein the determining the synergistic information component of the certain parameter comprises:
determining a total information of the certain parameter;
determining a redundant information component, based on information contained in multiple causal relationships having the certain parameter as effect parameter;
determining a unique information component, based on information contained in only one of the causal relationships having the certain parameter as effect parameter;

determining a self information component, based on information native to the certain parameter; and determining the synergistic information component by subtracting the unique information component, the redundant information component, and the self information component from the total information component.

9. The method according to claim 1, wherein the obtaining a plurality of causal relationships comprises:

receiving data values of a plurality of parameters of the machine or apparatus; and determining causal relationships between pairs of parameters based on the data values of the plurality of parameters.

10. The method according to claim 1, further comprising:

identifying that one of the determined causal relationships between a pair of parameters is spurious based on the diagnosed unobserved operational parameter; and removing the spurious causal relationship from the plurality of causal relationships.

11. The method according to claim 1, further comprising predicting a performance of the machine or apparatus based on at least in part the diagnosed unobserved operational parameter.

12. The method according to claim 1, wherein the machine or apparatus comprises a lithographic apparatus.

13. The method according to claim 1, wherein the machine or apparatus comprises a metrology tool.

14. The method according to claim 1, wherein the machine or apparatus comprises a lithographic cell.

15. A tool for diagnosing an unobserved operational parameter of a machine or apparatus, the tool comprising one or more processors and a memory storing instructions that, when executed by the one or more processors, result in the performance of at least the method according to claim 1.

16. A computer program product comprising a non-transitory computer-readable medium comprising machine-readable instructions therein, the instructions, upon execution by a processing system, configured to cause the processing system to at least perform the method of claim 1.

17. A method comprising:

obtaining a plurality of causal relationships between pairs of observable parameters of a machine or apparatus, wherein each pair comprises a cause parameter and an effect parameter;

determining, for at least some of the parameters, a decomposition of a parameter of the at least some parameters into a plurality of information components based on the obtained causal relationships between the parameters, wherein the decomposition comprises a synergistic information component comprising information obtained from a combination of at least two causal relationships having the parameter as effect parameter;

determining whether a certain parameter comprises a negative synergistic information component;

diagnosing, based on whether the negative synergistic information component exists, whether an unobserved operational parameter exists that provides a cause for the certain parameter comprising the negative synergistic information component; and performing control and/or validation of a system design for the machine or apparatus, based on whether an unobserved parameter is diagnosed, wherein the diagnosis that no unobserved operational parameter exists is used as validation of the system design.

18. A tool for performing control and/or validation of a system design for a machine or apparatus, the tool comprising one or more processors and a memory storing instructions that, when executed by the one or more processors, result in the performance of at least the method according to claim 17.

19. The method according to claim 17, further comprising determining a total information of a parameter of the at least some parameters based on information entropy of the parameter, wherein the sum of the information components of the parameter is equal to the total information of the parameter.

20. A computer program product comprising a non-transitory computer-readable medium comprising machine-readable instructions therein, the instructions, upon execution by a processing system, configured to cause the processing system to at least perform the method of claim 17.

* * * * *